(12) United States Patent
Yoon

(10) Patent No.: US 8,754,436 B2
(45) Date of Patent: *Jun. 17, 2014

(54) SEMICONDUCTOR LIGHT EMITTING DEVICE AND METHOD FOR MANUFACTURING THE SAME

(71) Applicant: LG Innotek Co., Ltd., Seoul (KR)

(72) Inventor: Ho Sang Yoon, Gwangju (KR)

(73) Assignee: LG Innotek Co., Ltd., Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 13/888,128

(22) Filed: May 6, 2013

(65) Prior Publication Data

US 2013/0240833 A1    Sep. 19, 2013

Related U.S. Application Data

(63) Continuation of application No. 13/028,920, filed on Feb. 16, 2011, now Pat. No. 8,436,384, which is a continuation of application No. 12/844,646, filed on Jul. 27, 2010, now Pat. No. 7,910,942, which is a continuation of application No. 12/103,593, filed on Apr. 15, 2008, now Pat. No. 7,791,094.

(30) Foreign Application Priority Data

Apr. 16, 2007 (KR) .................. 10-2007-0036857

(51) Int. Cl.
*H01L 33/00* (2010.01)

(52) U.S. Cl.
USPC .............. 257/98; 257/E33.005; 257/E33.067; 257/E33.074

(58) Field of Classification Search
USPC .............. 257/98, E33.005, E33.067, E33.074
See application file for complete search history.

(56) References Cited

U.S. PATENT DOCUMENTS

| 5,309,468 | A  | * | 5/1994  | Makiuchi      | 372/50.23 |
| 5,779,924 | A  | * | 7/1998  | Krames et al. | 216/24    |
| 6,495,862 | B1 | * | 12/2002 | Okazaki et al.| 257/103   |
| 7,476,910 | B2 | * | 1/2009  | Fujimoto et al.| 257/95   |
| 7,910,942 | B2 | * | 3/2011  | Yoon          | 257/98    |
| 8,436,384 | B2 | * | 5/2013  | Yoon          | 257/98    |
| 2006/0056474 | A1 | * | 3/2006 | Fujimoto et al.| 372/43.01 |
| 2009/0026475 | A1 | * | 1/2009 | Yamaguchi et al.| 257/98 |
| 2009/0042325 | A1 | * | 2/2009 | Fujimoto et al.| 438/22 |
| 2010/0022044 | A1 | * | 1/2010 | Fujii         | 438/32    |
| 2010/0149442 | A1 | * | 6/2010 | Miyao et al.  | 349/5     |

FOREIGN PATENT DOCUMENTS

JP    7-277884 A    10/1995

* cited by examiner

*Primary Examiner* — Victor A Mandala
(74) *Attorney, Agent, or Firm* — Birch, Stewart, Kolasch & Birch, LLP

(57) ABSTRACT

Disclosed are a semiconductor light emitting device and a method for manufacturing the same. The semiconductor light emitting device comprises a substrate under a light emitting structure having an active layer. A bottom surface of the substrate includes a first portion and a second portion around the first portion, the first portion includes a first recess and the second portion includes a second recess, and the first recess and the second recess are formed in a direction toward the upper surface from the bottom surface of the substrate. The first recess and the second recess have a different depth from the bottom surface of the substrate, the first recess is formed along a transverse direction and a longitudinal direction in the bottom surface of the substrate, and the first recess and the second recess has a depth smaller than a thickness of the substrate.

19 Claims, 7 Drawing Sheets

US 8,754,436 B2

SEMICONDUCTOR LIGHT EMITTING DEVICE AND METHOD FOR MANUFACTURING THE SAME

CROSS REFERENCE TO RELATED APPLICATIONS

This application is a Continuation of co-pending U.S. application Ser. No. 13/028,920, filed Feb. 16, 2011, which is Continuation of U.S. application Ser. No. 12/844,646, filed Jul. 27, 2010, now U.S. Pat. No. 7,910,942, issued on Mar. 22, 2011, which is Continuation of U.S. application Ser. No. 12/103,593, filed Apr. 15, 2008, now U.S. Pat. No. 7,791,094, issued on Sep. 7, 2010, which claims priority under 35 U.S.C. §119 to Korean Patent Application No. 10-2007-0036857, filed on Apr. 16, 2007. The entire contents of each of these applications are incorporated herein by reference.

BACKGROUND

Groups III-V nitride semiconductors have been variously applied to an optical device such as blue and green light emitting diodes (LED), a high speed switching device, such as a MOSFET (Metal Semiconductor Field Effect Transistor) and an HEMT (Hetero junction Field Effect Transistors), and a light source of a lighting device or a display device.

The nitride semiconductor is mainly used for the LED (Light Emitting Diode) or an LD (laser diode), and studies have been continuously conducted to improve the manufacturing process or a light efficiency of the nitride semiconductor.

SUMMARY

The embodiment provides a semiconductor light emitting device capable of improving uniformity in a wavelength of the semiconductor light emitting device and a method for manufacturing the same.

The embodiment provides a semiconductor light emitting device capable of improving temperature distribution and a curvature of a substrate by using a pattern formed in a backside of the substrate and a method for manufacturing the same.

The embodiment provides a semiconductor light emitting device comprising; a substrate; and a light emitting structure on an upper surface of the substrate and comprising a first conductive semiconductor layer, a second conductive semiconductor layer, and an active layer between the first conductive semiconductor layer and second conductive semiconductor layer, wherein a bottom surface of the substrate includes a first portion and a second portion around the first portion, wherein the first portion includes a first recess and the second portion includes a second recess, wherein the first recess and the second recess are formed in a direction toward the upper surface from the bottom surface of the substrate, wherein the first recess and the second recess have a different depth from the bottom surface of the substrate, wherein the first recess is formed along a transverse direction and a longitudinal direction in the bottom surface of the substrate, and wherein the first recess and the second recess has a depth smaller than a thickness of the substrate.

The embodiment provides a semiconductor light emitting device comprising; a substrate; a light emitting structure on an upper surface of the substrate and comprising a first conductive semiconductor layer, a second conductive semiconductor layer, and an active layer between the first conductive semiconductor layer and second conductive semiconductor layer; and a first semiconductor layer between the substrate and a bottom surface of the light emitting structure, wherein a bottom surface of the substrate includes a first portion and a second portion around the first portion, wherein the first portion includes a first recess and the second portion includes a second recess, wherein the first recess and the second recess are formed in a direction toward the upper surface from the bottom surface of the substrate, wherein the first recess and the second recess have a different depth from the bottom surface of the substrate, wherein the first recess is formed along a transverse direction and a longitudinal direction in the bottom surface of the substrate, wherein the first recess and the second recess has a depth smaller than a thickness of the substrate.

The embodiment provides a method for manufacturing a semiconductor light emitting device comprising; the steps of forming concave-convex patterns in at least a portion of a backside of a substrate, and forming a light emitting structure comprising an active layer on the substrate.

DETAILED DESCRIPTION OF THE EMBODIMENTS

Hereinafter, a semiconductor light emitting device and a method for manufacturing the same according to the embodiment will be described with reference to the accompanying drawings.

Figure 1:
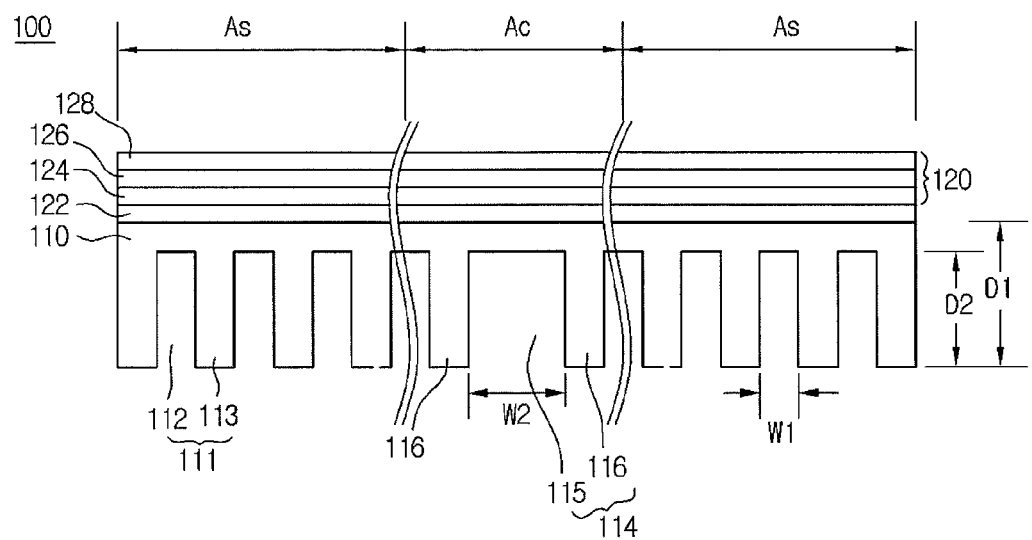
FIG. 1 is a side sectional view representing a semiconductor light emitting device according to a first embodiment.
Figure 2:
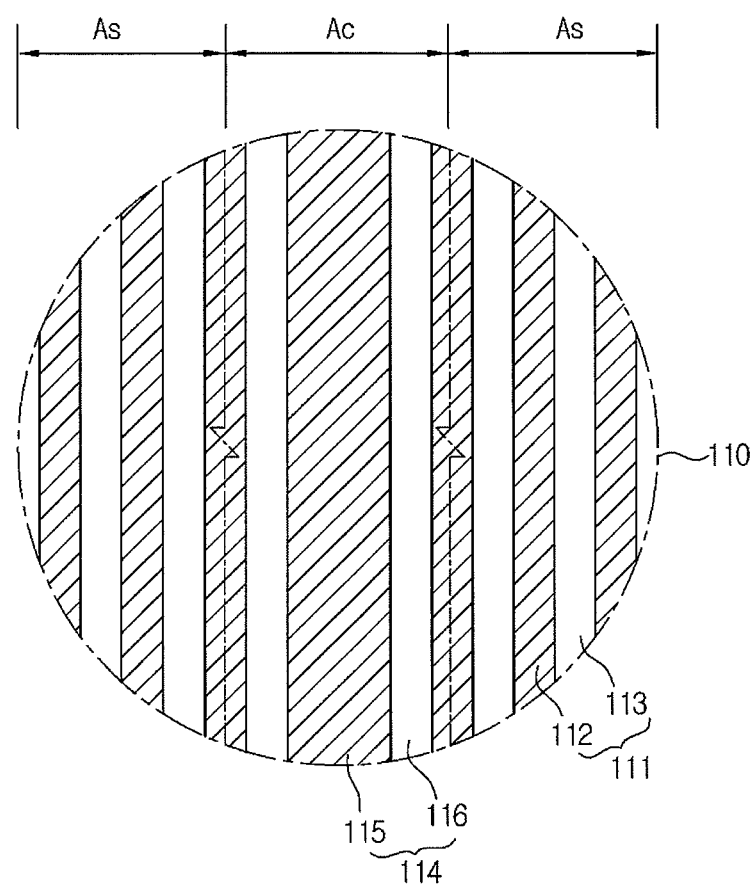
FIG. 2 is a plan view representing a structure of a pattern formed in a backside of a substrate shown in FIG. 1.

FIG. 1 is a sectional view representing a semiconductor light emitting device according to the embodiment, and FIG. 2 is a plan view representing an example of a backside of a substrate shown in FIG. 1.

As shown in FIGS. 1 and 2, a semiconductor light emitting device 100 comprises a substrate 110, a buffer layer 122 and a light emitting structure 120.

The substrate 110 comprises at least one selected from the group consisting of sapphire (Al2O3), GaN, SiC, ZnO, GaP, GaAs and Si.

Concave-convex patterns 111 and 114 are formed in a backside of the substrate 110. A first partial pattern is formed in the backside of the substrate 110 by using a stepper, and then a next partial pattern is formed such that the first partial pattern overlaps with the next partial pattern, thereby forming the concave-convex patterns 111 and 114. In addition, the concave-convex patterns 111 and 114 may be formed by performing at least one of a wet etching process and a dry etching process with respect to the backside of the substrate 110.

The concave-convex patterns 111 and 114 are formed along a transverse direction or a longitudinal direction in such a manner that concave patterns 112 and 115 and convex patterns 113 and 116 of the concave-convex patterns 111 and 114 are alternately formed. For example, the concave-convex patterns 111 and 114 may be alternately formed along the transverse direction as shown in FIG. 2. In addition, the concave-convex patterns 111 and 114 can be aligned along the longitudinal direction, or a transverse/longitudinal direction. As shown in FIG. 2, the concave-convex patterns 111 and 114 are formed in a stripe shape along the first or second direction.

A first concave-convex pattern 111 (112 and 113) and a second concave-convex pattern 114 (115 and 116) may be formed in different areas, respectively. According to the embodiment, the substrate 110 is divided into a center area Ac and both side areas As based on the direction of the pattern formed in the backside of the substrate 110. In the present embodiment, the patterns are formed in the longitudinal direction while being aligned in the transverse direction. The center area Ac of the backside of the substrate 110 is equal to or less than a ⅓ radius of the substrate 110, and the side area As is a remaining area except for the center area Ac.

A plurality of first concave-convex patterns 111 are formed at both side areas As of the backside of the substrate 110, and a plurality of second concave-convex patterns 114 are formed at the center area Ac of the backside of the substrate 110.

The first concave-convex patterns 111 are formed at predetermined intervals and a first concave pattern 112 has a predetermined width W1. The second concave-convex patterns 114 are formed at predetermined intervals and a second concave pattern 115 has a width W2 larger than the width W1. The width W2 is 1.5 to 2.5 times as large as the width W1. According to another example, a concave pattern may have a width that becomes narrower step by step from the center area Ac to the both side areas As of the backside of the substrate 110.

The concave pattern 115 formed in the backside of the substrate 110 has the width W2 of 1 to 10 um, and the concave patterns 112 and 115 have a depth D2 of 200 to 400 um. The depth D2 of the concave patterns 112 and 115 may be changed corresponding to a depth D1 of the substrate 110 (for instance, about 430 um).

The concave patterns 112 and 115 and/or convex patterns 113 and 116 formed in the backside of the substrate 110 may have a cross section of a polygonal shape, a horn-shape or a hemisphere shape, but the embodiment is not limited thereto.

Although the embodiment represents a structure comprising the concave-convex patterns 111 and 114 formed at the entire area of the substrate 110, the concave-convex patterns 111 and 114 may be formed only at a partial area, which generates a large quantity of heat, that is, at the center area Ac of the substrate 110 along the longitudinal direction and/or the transverse direction.

The substrate 110 is mounted on a susceptor of a semiconductor manufacturing apparatus. The semiconductor manufacturing apparatus comprises an MOCVD (Metal Organic Chemical Vapor Deposition) apparatus, an MBE (Molecular Beam Epitaxy) apparatus, and a CVD (Chemical Vapor Deposition) apparatus. Elements, such as a gallium nitride based semiconductor light emitting device, an HEMT (High Electron Mobility Transistor), an FET (Field Effect Transistor) and a laser diode, are grown on the substrate (not shown) by using such apparatuses. Hereinafter, a structure comprising the gallium nitride based semiconductor light emitting device formed on the substrate 110 will be described as an example.

A buffer layer 122 is formed on the substrate 110. NH3 and TMGa (or TEGa) are supplied at a predetermined growth temperature (for example, around 500° C.), so that the buffer layer 112 is formed with a predetermined thickness. The buffer layer 122 serves to reduce a lattice constant between an upper surface of the substrate 110 and a GaN semiconductor layer, and may comprise at least one selected from the group consisting of GaN, AlN, AlGaN, InGaN and AlInGaN.

An undoped semiconductor layer (not shown) which is not doped with dopants may be formed on the buffer layer 122. The buffer layer 122 or the undoped semiconductor layer may exist, or both the buffer layer 122 and the undoped semiconductor layer may not exist.

A light emitting structure 120 is formed on the buffer layer 122. The light emitting structure 120 comprises a first conductive semiconductor layer 124, an active layer 126 and a second conductive semiconductor layer 128. The light emitting structure 120 comprises a P-N structure, in which the first conductive semiconductor layer 124 is prepared in the form of an N-type semiconductor layer and the second conductive semiconductor layer 128 is prepared in the form of a P-type semiconductor layer. The light emitting structure 120 may comprise a P-N junction structure, an N-P junction structure, an N-P-N junction structure or a P-N-P junction structure. Hereinafter, the following description will be made in relation to the P-N junction structure as an example.

The first conductive semiconductor layer 124 is formed on the buffer layer 122. The first conductive semiconductor layer 124 is formed in the form of the N-type semiconductor layer, and an N—GaN layer is grown by providing gas comprising n-type dopants such as NH3, TMGa (or TEGa) and Si at a high-growth temperature (for example, 900° C. or above) for a predetermined time (for example, 7200 sec or above) such that the N—GaN layer has a predetermined thickness. The first conductive semiconductor layer 124 comprises at least one selected from the group consisting of GaN, AlGaN, InGaN, InN, AlN and InAlGaN. The first conductive semiconductor layer 124 is doped with n-type dopants such as Si, Ge, Sn, Se and Te.

The active layer 126 comprising a single quantum well structure or a multiple quantum well structure is formed on the first conductive semiconductor layer 124. The active layer 126 is grown by providing gas comprising NH3, TMGa, and TMIn at a predetermined growth temperature, so that the active layer 126 comprises an InGaN/GaN structure.

A second conductive semiconductor layer 128 is formed on the active layer 126. The second conductive semiconductor layer 128 comprises the P-type semiconductor layer. The P-type semiconductor layer comprises at least one selected from the group consisting of GaN, GaN, InN, AlN, InGaN, AlGaN and InAlGaN, and is doped with p-type dopants such as Mg, Be and Zn.

Such nitride semiconductor layers 122, 124, 126 and 128 are grown within a temperature range between hundreds of degrees and thousands of degrees (for example, within a temperature range between 500 and 1200° C.). In particular, the N-type semiconductor layer 124 is grown at a high temperature of 900° C. or above.

When the semiconductor layers are grown, if a pattern does not exist in the backside of the substrate 110, various problems may occur. For example, while the N-type semiconductor layer having a high-temperature is being grown, the temperature of the center area Ac is relatively increased and the temperature of the side area As of the substrate 110 is relatively lowered. Accordingly, a concave-up phenomenon occurs at the center area Ac of the substrate 110, and the concave-up phenomenon exerts an influence upon a growth of the active layer 126, thereby deteriorating wavelength uniformity over the whole area of the substrate 110. That is, a problem occurs in that a wavelength of the semiconductor light emitting device 100 formed at the center area Ac of the substrate 110 is relatively short and a wavelength of the semiconductor light emitting device 100 formed on the side area As is relatively long.

To this end, the concave-convex patterns 111 and 114 are formed in the backside of the substrate 110. The second concave-convex pattern 114 formed at the center area Ac reduces temperature deviation between the center area Ac and the side area As. In addition, the second concave-convex pattern 114 attenuates the concave-up phenomenon at the center area Ac of the substrate 110 and improves the wavelength uniformity of the semiconductor light emitting device 100 which is formed on the substrate 110.

Figure 3:
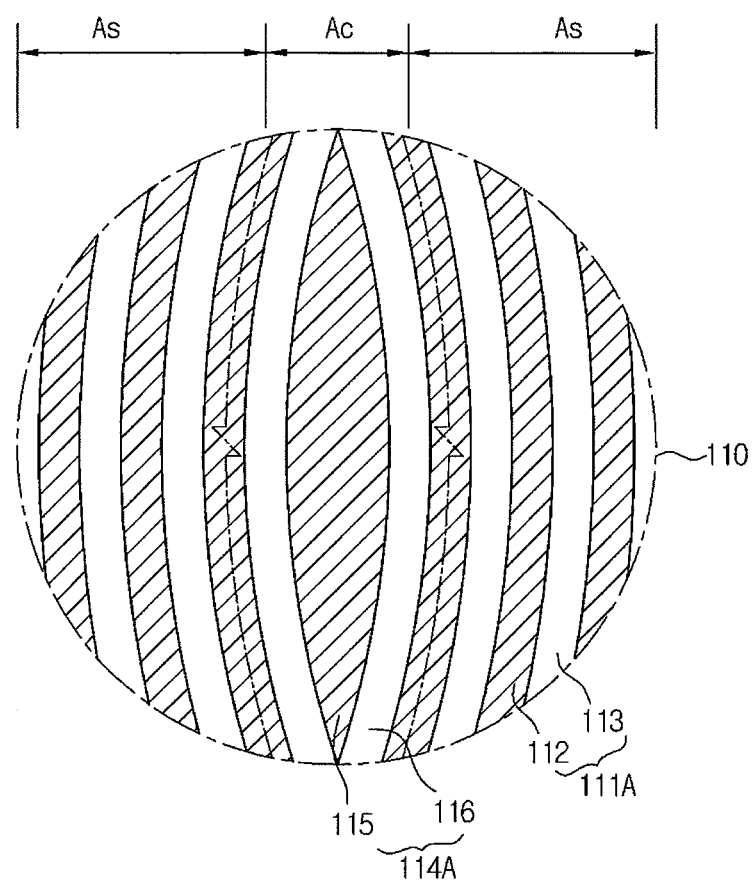
FIG. 3 is a plan view representing another example of a structure of a pattern formed in a backside of the substrate shown in FIG. 1.

FIG. 3 is a plan view representing an another example of a concave-convex pattern formed in the backside of the substrate shown in FIG. 1.

As shown in FIG. 3, concave-convex patterns 111A and 114A formed in the backside of the substrate 110 comprise an oval shape and are symmetrical to each other about the center of the backside of the substrate 110. When the patterns 111A and the 114A are formed, a width of at least center area of the second concave pattern 115 of the center area Ac has a width larger than that of a first concave pattern 112 of the side area As. The patterns 111A and 114A comprise a rhombus shape or a circle shape, and the shape of patterns 111A and 114A may be changed according to embodiments.

Figure 4:
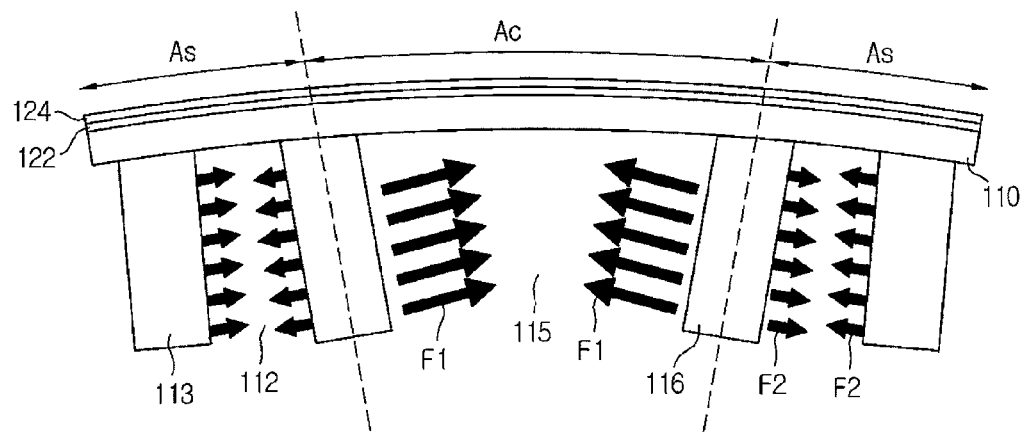
FIG. 4 is a view representing the substrate, in which the center area of the substrate is concave-down during a growth of a semiconductor layer according to the first embodiment.

FIG. 4 is a view representing the substrate, in which the center area of the substrate is concave-down during a growth of the semiconductor layer according to the first embodiment.

As shown in FIG. 4, the buffer layer 122 and the first conductive semiconductor layer 124 are sequentially formed on the substrate 110 comprising the concave-convex patterns 112, 113, 115 and 116.

At the center area Ac of the substrate 110, an interference of heat F1 between two convex patterns 116 is reduced or removed by the second concave pattern 115. In this case, the center area Ac is deformed to be concave-down. The concave-down deformation occurring at the center area Ac of the substrate 110 offsets the concave-up deformation, thereby reducing the concave-up deformation, which occurs at the center area Ac of the substrate 110 when the first conductive semiconductor layer 124 is formed at the high temperature.

In addition, at the side area As of the substrate 110, an interference of heat F2 between two convex patterns 113 is increased by the first concave pattern 112, and the temperature of the side area As is increased, so that the substrate 110 is scarcely deformed at the side area As.

Figure 5:
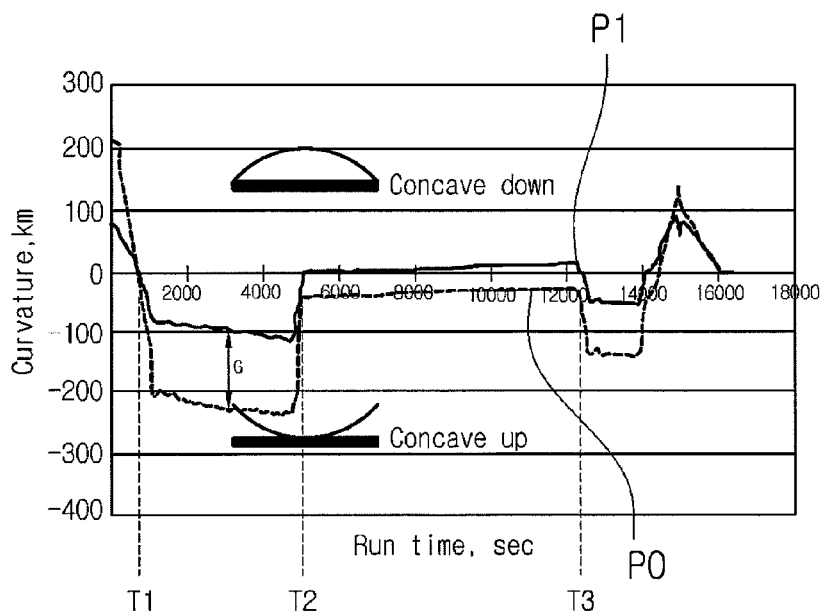
FIG. 5 is a view for comparing curvatures between the substrate according to the first embodiment and a conventional substrate when the semiconductor light emitting device is manufactured.

FIG. 5 is a view for comparing curvatures of the substrate according to the first embodiment and a conventional substrate when the semiconductor light emitting device is manufactured. A graph P0 represents a curvature of a conventional substrate which does not comprise a concave-convex pattern at the backside thereof. A graph P1 represents a curvature of the substrate according to the embodiment. In addition, a run time for the semiconductor layer provided on the substrate is an illustrative purpose only, and the embodiment is not limited thereto.

As shown in FIG. 5, the buffer layer 122, the N-type semiconductor layer 124, the active layer 126 and the P-type semiconductor layer 128 are sequentially formed on the substrate 110 comprising the concave-convex patterns 111 and 114. The buffer layer 122 is formed within a time of T1 (for example, 1000 sec or below), and the N-type semiconductor layer 124 is formed within a range of T1 to T2 (for example, 1000 to 5000 sec). In addition, the active layer 126 is formed within a range of T2 to T3 (for example, 500 to 12000 sec).

Referring to T1 to T2 corresponding to the run time of the N-type semiconductor 124, the curvature of the substrate 110 of the P1 is about −100 and the curvature of the substrate 110 of the graph P0 is −200 or below, thereby causing a predetermined gap between the curvatures. Accordingly, when the N-type semiconductor layer 124 according to the embodiment is grown, the graph P1 representing the curvature of the substrate according to the embodiment is improved by 2 to 2.5 times as compared with the graph P0 representing the curvature of the substrate which does not comprise the patterns at the backside thereof.

In other words, when the N-type semiconductor layer 124 is formed on the substrate 110, the concave-convex patterns 111 and 114 formed in the backside of the substrate 110 cause the concave-down phenomenon, and the concave-down phenomenon offsets the concave-up phenomenon, which naturally occurs on the substrate 110, thereby improving the curvature of the substrate 110 by 2 times or above.

In addition, when the active layer 126 is formed after the N-type semiconductor layer 124 has been formed, the curvature of the substrate 110 represents approximately 0. Accordingly, the active layer 126 can be grown on the entire area of the substrate 110 at the uniform temperature, thereby preventing the wavelength of the semiconductor light emitting device 100 from being increased in the direction of the side area As of the substrate 110. In addition, the wavelength for the radiated light has uniform wavelength distribution over the entire area of the substrate, so that the wavelength uniformity of the substrate 110 can be improved.

Figure 6:
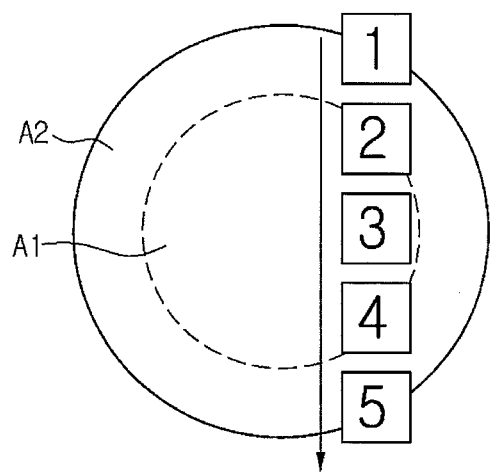
FIG. 6 is a view representing uniformity of a wavelength of the semiconductor light emitting device grown on the substrate according to the first embodiment.

FIG. 6 is a view representing wavelength uniformity of the semiconductor light emitting device grown on the substrate according to the first embodiment.

As shown in FIG. 6, the wavelength distribution for the semiconductor light emitting device 100 grown on the substrate 110 may vary depending on areas comprising a center area A1 and an edge area A2 of the substrate 110. That is, the semiconductor light emitting device 100 grown on the substrate 110 according to the embodiment has wavelength distribution which is differently represented in two areas A1 and A2 due to the pattern formed in the backside of the substrate 110, the uniform temperature distribution and the concave down deformation. The semiconductor light emitting device grown on the conventional substrate has wavelength distribution corresponding to the fifth area 5 due to non-uniform temperature distribution. According to the embodiment, the wavelength uniformity of the semiconductor light emitting device on the substrate can be improved.

In addition, a wavelength of the semiconductor light emitting device 100 grown at the center area A1 of the substrate 110 may not be lengthened as compared with a reference value and a wavelength of the semiconductor light emitting device 100 grown on the edge area A2 of the substrate 110 may not be shortened as compared with the reference value.

Figure 7:
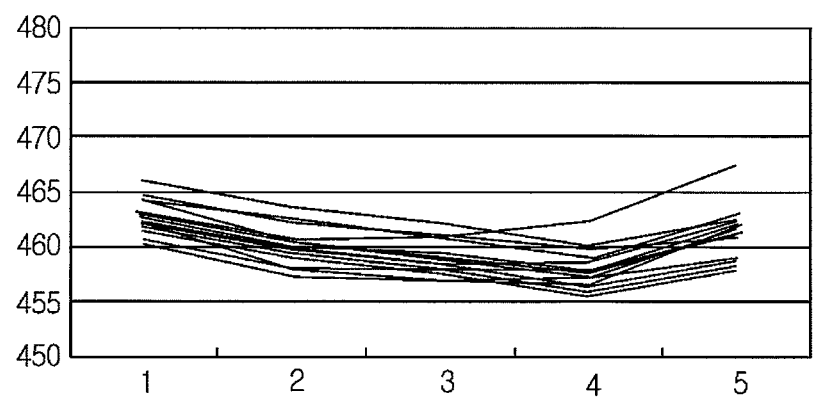
FIG. 7 is a graph representing wavelength distribution in various positions of the substrate shown in FIG. 6.

FIG. 7 is a graph representing the wavelength distributions in various positions (1 to 5) of the substrate shown in FIG. 6.

FIG. 7 is a graph representing the wavelength uniformity for a PL (Photo Luminescence) and an EL (Electronic Luminescence) corresponding to the areas of 1 to 5 of the substrate shown in FIG. 6. The graphs correspond to the number of substrates, and the graphs are obtained by measuring data from 14 substrates, which are grown in an outer area of the susceptor. Referring to such data, the semiconductor light emitting device 100 has a wavelength of 450 to 465 nm in each position of the 1 to 5 areas of the substrate 110, so that the semiconductor has uniform wavelength distribution.

Figure 8:
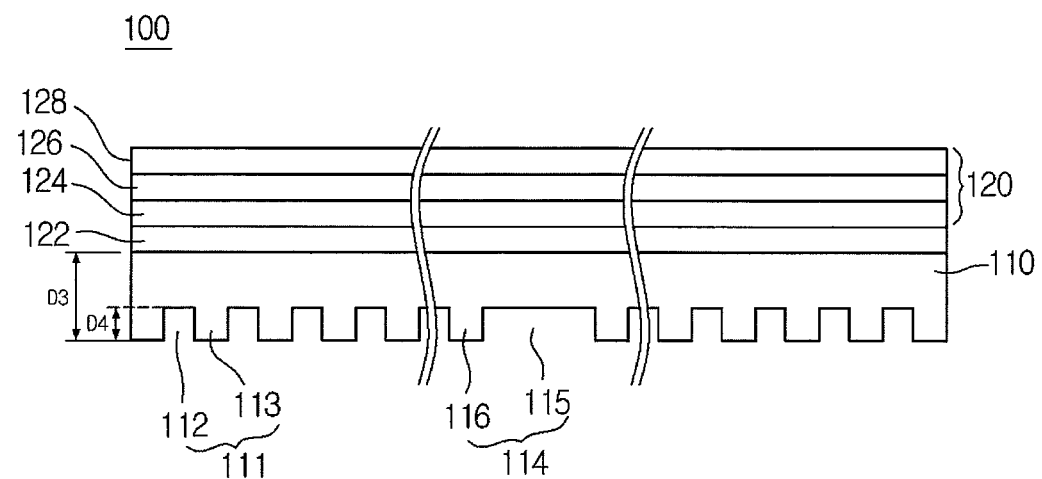
FIG. 8 is a side sectional view representing the substrate of the semiconductor light emitting device according to the first embodiment, which has been subject to a lapping process and a polishing process.

FIG. 8 is a side sectional view representing a state of the substrate of the semiconductor light emitting device according to the first embodiment, in which the substrate is subject to a lapping process and a polishing process.

As shown in FIG. 8, semiconductor layers 122 to 128 are formed on the substrate 110. Then, a chip pattern (not shown) is formed on a surface of the second conductive semiconductor layer 128. After that, a lapping process and a polishing process are performed in the backside of the substrate 110. In this case, the substrate, which has been subject to the lapping and polishing processes, has a thickness D3 of 80 to 130 μm. The concave-convex patterns 111 and 114 have a depth D4 of 0.1 to 10 μm.

In addition, if the chip is prepared in a size of 500*250 μm, the number of concave-convex patterns 112, 113, 115 and 116 comprised in the individual chip is about 625 to 52500. The number of the concave-convex patterns 112, 113, 115 and 116 may be changed corresponding to a size of the chip and an interval between the patterns.

Figure 9:
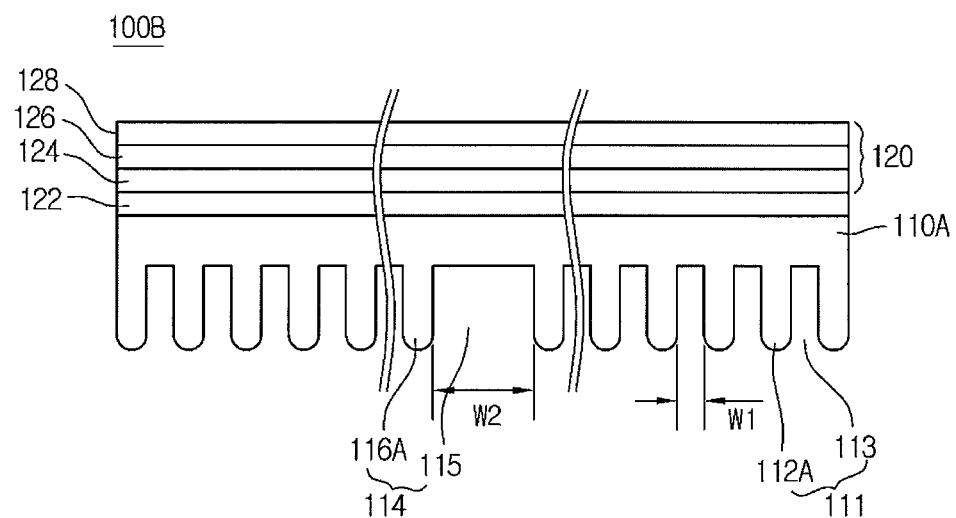
FIG. 9 is a side sectional view representing a semiconductor light emitting device according to a second embodiment.

FIG. 9 is a side sectional view representing a light emitting device 100B according to a second embodiment. The same reference numerals will be assigned to the same elements which are identical to the elements according to the first embodiment, and detailed description thereof will be omitted in order to avoid redundancy.

As shown in FIG. 9, convex patterns 112A and 116A of concave-convex patterns 111 and 114 formed in the backside of a substrate 110A has a hemispheric shape. The convex patterns 112A and 116A comprising the hemispheric shape may effectively control heat transferred from the susceptor to the substrate 110.

Figure 10:
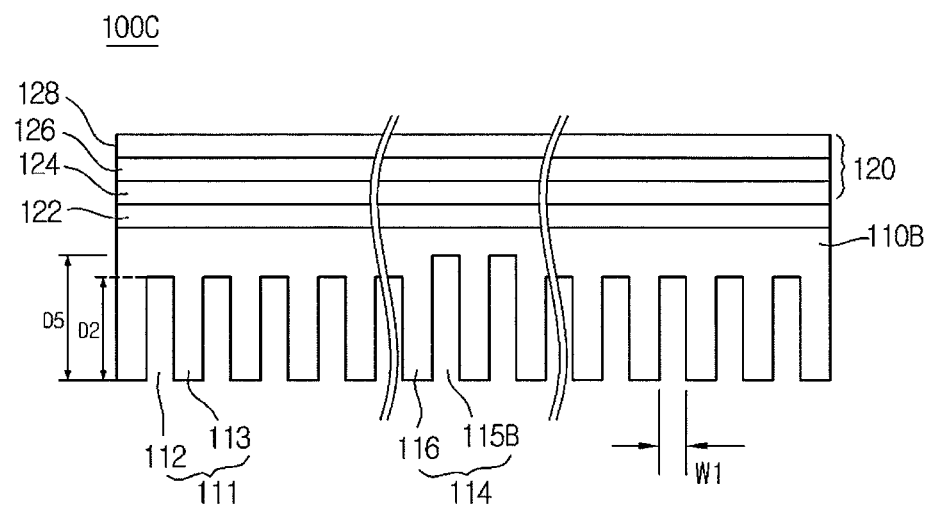
FIG. 10 is a side sectional view representing a semiconductor light emitting device according to a third embodiment.

FIG. 10 is a side sectional view representing a light emitting device 100C according to a third embodiment. The same reference numerals will be assigned to the same elements which are identical to the elements according to the first embodiment, and detailed description thereof will be omitted in order to avoid redundancy.

As shown in FIG. 10, concave-convex patterns 111 and 114 formed in the backside of a substrate 110B may have a predetermined period. A concave pattern 115B formed at a center area of the substrate 110B has a depth D5 deeper than a depth D2 of the concave pattern 112 formed at a side area. The concave pattern 115B reduces thermal expansion and lowers the temperature between convex patterns 116, so that the uniform temperature distribution is achieved over the entire area of the substrate 110B.

Figure 11:
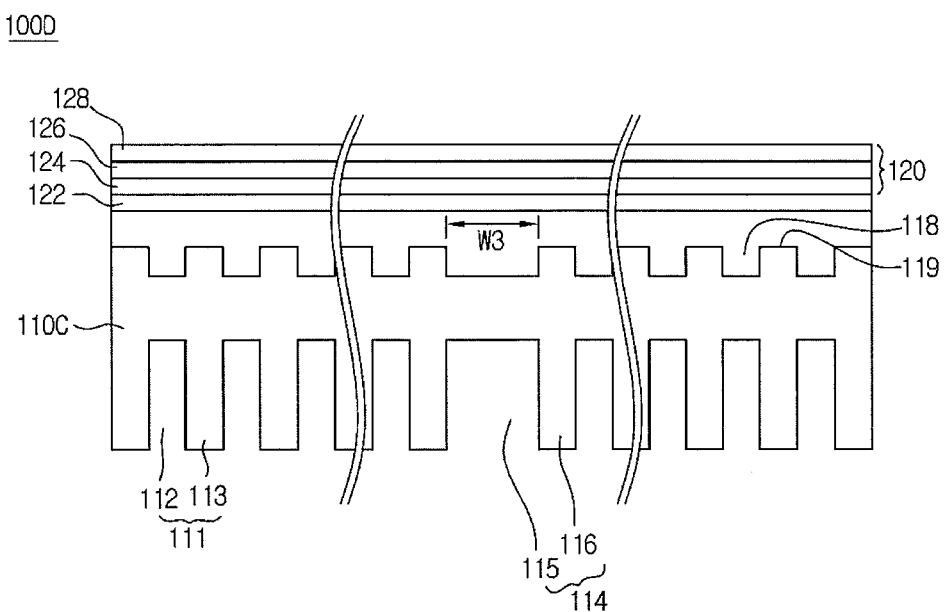
FIG. 11 is a side sectional view representing a semiconductor light emitting device according to a fourth embodiment.

FIG. 11 is a side sectional view representing a light emitting device 100D according to a fourth embodiment. The same reference numerals will be assigned to the same elements which are identical to the elements according to the first embodiment, and detailed description thereof will be omitted in order to avoid redundancy.

As shown in FIG. 11, concave-convex patterns 111 and 114 are formed in the backside of a substrate 110C, and concave-convex patterns 118 and 119 are formed in the top-side of the substrate 110C. A concave pattern 118 formed at a center area of the top-side of the substrate 110C have a large width W3, or a distance between two convex pattern formed at a center area of the top-side of the substrate 110C have a large interval. Through a structure of the patterns formed in the backside and the top-side of the substrate 110C, the temperature of the substrate 110C is uniformly controlled, thereby improving the wavelength uniformity of the semiconductor light emitting device grown on the substrate 110C.

Although the embodiment has been made in relation to the compound semiconductor light emitting device comprising the N-P junction structure as an example, the compound semiconductor light emitting device comprising an N-P-N structure, a P-N structure or a P-N-P structure can be implemented. In the description of the embodiment, it will be understood that, when a layer (or film), a region, a pattern, or a structure is referred to as being "on (above/over/upper)" or "under (below/down/lower)" another substrate, another layer (or film), another region, another pad, or another pattern, it can be directly on the other substrate, layer (or film), region, pad or pattern, or intervening layers may also be present. Furthermore, it will be understood that, when a layer (or film), a region, a pattern, a pad, or a structure is referred to as being "between" two layers (or films), regions, pads or patterns, it can be the only layer between the two layers (or films), regions, pads, or patterns or one or more intervening layers may also be present. Thus, it should be determined by technical idea of the invention.

Any reference in this specification to "one embodiment," "an embodiment," "example embodiment," etc., means that a particular feature, structure, or characteristic described in connection with the embodiment is comprised in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or alignments of the subject combination alignment within the scope of the disclosure, the drawings and the appended claims. In addition to variations and modifications in the component parts and/or alignments, alternative uses will also be apparent to those skilled in the art.

What is claimed is:

1. A semiconductor light emitting device, comprising:
   a substrate; and
   a light emitting structure on an upper surface of the substrate and comprising a first conductive semiconductor layer, a second conductive semiconductor layer, and an active layer between the first conductive semiconductor layer and second conductive semiconductor layer, wherein a bottom surface of the substrate includes a first portion and a second portion around the first portion, wherein the first portion includes a first recess and the second portion includes a second recess, wherein the first recess and the second recess are formed in a direction toward the upper surface from the bottom surface of the substrate, wherein the first recess and the second recess have a different depth from the bottom surface of the substrate, wherein the first recess is formed along a transverse direction and a longitudinal direction in the bottom surface of the substrate, and wherein the first recess and the second recess have a depth smaller than a thickness of the substrate.

2. The semiconductor light emitting device as claimed in claim 1, wherein the first recess has a cross section of a polygonal shape or a hone-shape.

3. The semiconductor light emitting device as claimed in claim 1, wherein the bottom surface of the substrate is formed in a flat surface between the first recess and the second recess.

4. The semiconductor light emitting device as claimed in claim 1, wherein the first recess and the second recess are alternately formed.

5. The semiconductor light emitting device as claimed in claim 1, wherein the second recess is formed as a plurality of second recesses adjacent to the first portion, wherein a portion of the first recess is located at a center area of the plurality of second recesses, and wherein the plurality of second recesses are spaced apart from each other.

6. The semiconductor light emitting device as claimed in claim 1, wherein the first recess is disposed at a center area of the bottom surface of the substrate.

7. The semiconductor light emitting device as claimed in claim 6, wherein the second portion is spaced apart from the center area of the bottom surface of the substrate.

8. The semiconductor light emitting device as claimed in claim 1, wherein one of the first recess and the second recess has a depth of about 200 to 400 μm which is smaller than the thickness of the substrate.

9. The semiconductor light emitting device as claimed in claim 1, wherein one of the first recess and the second recess has a depth of about 0.1 to 10 μm which is smaller than the thickness of the substrate.

10. The semiconductor light emitting device as claimed in claim 1, wherein the first recess has a width of about 0.1 to 10 μm.

11. The semiconductor light emitting device as claimed in claim 1, wherein the first recess has the depth deeper than that of the second recess.

12. The semiconductor light emitting device as claimed in claim 9, wherein the substrate has a thickness of 80 μm or more.

13. The semiconductor light emitting device as claimed in claim 1, wherein the substrate includes one of sapphire ($Al_2O_3$), GaN, SiC, ZnO, GaP, GaAs and Si.

14. The semiconductor light emitting device as claimed in claim 1, further comprising:

at least one of a buffer layer and an undoped semiconductor layer between the first conductive semiconductor layer and the substrate.

15. A semiconductor light emitting device, comprising:

a substrate;

a light emitting structure on an upper surface of the substrate and comprising a first conductive semiconductor layer, a second conductive semiconductor layer, and an active layer between the first conductive semiconductor layer and second conductive semiconductor layer; and a first semiconductor layer between the substrate and a bottom surface of the light emitting structure, wherein a bottom surface of the substrate includes a first portion and a second portion around the first portion, wherein the first portion includes a first recess and the second portion includes a second recess, wherein the first recess and the second recess are formed in a direction toward the upper surface from the bottom surface of the substrate, wherein the first recess and the second recess have a different depth from the bottom surface of the substrate, wherein the first recess is formed along a transverse direction and a longitudinal direction in the bottom surface of the substrate, and wherein the first recess and the second recess have a depth smaller than a thickness of the substrate.

16. The semiconductor light emitting device as claimed in claim 15, wherein the first recess has a width different from a width of the second recess.

17. The semiconductor light emitting device as claimed in claim 15, wherein the first recess has the depth deeper than that of the second recess.

18. The semiconductor light emitting device as claimed in claim 15, wherein the second recess is adjacent to a sidewall of the substrate.

19. The semiconductor light emitting device as claimed in claim 15, wherein the second recess is adjacent to a plurality of sidewalls of the substrate.

* * * * *